United States Patent
McCracken et al.

(10) Patent No.: US 6,279,073 B1
(45) Date of Patent: Aug. 21, 2001

(54) CONFIGURABLE SYNCHRONIZER FOR DOUBLE DATA RATE SYNCHRONOUS DYNAMIC RANDOM ACCESS MEMORY

(75) Inventors: David E. McCracken, San Francisco, CA (US); David L. McCall, Eau Claire, WI (US)

(73) Assignee: Silicon Graphics, Inc., Mountain View, CA (US)

( * ) Notice: Subject to any disclaimer, the term of this patent is extended or adjusted under 35 U.S.C. 154(b) by 0 days.

(21) Appl. No.: 09/410,137

(22) Filed: Sep. 30, 1999

(51) Int. Cl.[7] .................................................. G06F 12/00
(52) U.S. Cl. ............................................................. 711/105
(58) Field of Search ................................... 711/105, 104, 711/101; 365/193, 194

(56) References Cited

U.S. PATENT DOCUMENTS

| | | | |
|---|---|---|---|
| 5,923,613 | * 7/1999 | Tien et al. | 365/233 |
| 5,950,223 | * 9/1999 | Chiang et al. | 711/105 |
| 5,978,281 | 11/1999 | Anand et al. | 365/189.05 |
| 6,034,916 | * 3/2000 | Lee | 365/233 |
| 6,078,546 | * 6/2000 | Lee | 365/233 |

OTHER PUBLICATIONS

Kim et al, "A 64–Mbit, 640–MByte/s Bidirectional Data Strobed, Double–Data–Rate SDRAM with a 40–mW DLL for a 256–MByte Memory System," IEEE Journal of Solid–State Circuits, vol. 33, No. 11, pp. 1703–1710, Nov., 1998.*

International Search Report in International Application No. PCT/US 00/25296, dated Dec. 6, 2000, 7 pages.

* cited by examiner

Primary Examiner—Tuan V. Thai
Assistant Examiner—Stephen C. Elmore
(74) Attorney, Agent, or Firm—Baker Botts L.L.P.

(57) ABSTRACT

A configurable synchronizer (10) for DDR-SDRAM (12) is provided that includes a strobe select module (40) operable to receive a memory select signal (106) and to pass strobe signals (20, 30) from one or more DDR-SDRAMs (16, 18) to a number of synchronizer circuits (44) corresponding to data signals (17) passed in parallel by each DDR-SDRAM as indicated by the memory select signal (106). A rising edge latch (174) receives a rising edge data signal (170) and latches the rising edge data signal (170) through the rising edge latch (174) on a rising edge of the strobe signal (152). A falling edge latch (176) receives a falling edge data signal (172) and latches the falling edge data signal (172) through the falling edge latch (176) on a falling edge of the strobe signal (152). A data signal selector (180) receives a data order control signal (195) and forwards the rising edge data signal (170) from the rising edge latch (174) to an intermediate output (196) on either a rising edge of a memory clock cycle (193) or a falling edge of a memory clock cycle (193) followed by forwarding the falling edge data signal (172) from the falling edge latch (176) to the intermediate output (196) on an opposite edge of the memory clock cycle (193) in response to the data order control signal (195). An output latch (202) receives the intermediate output (196) and latches the intermediate output (196) through the output latch (202) to an output signal (154) on each core clock cycle (190).

20 Claims, 4 Drawing Sheets

CONFIGURABLE SYNCHRONIZER FOR DOUBLE DATA RATE SYNCHRONOUS DYNAMIC RANDOM ACCESS MEMORY

TECHNICAL FIELD OF THE INVENTION

This invention relates in general to the field of computer systems and more particularly to an improved configurable synchronizer for double data rate synchronous dynamic random access memory (DDR-SDRAM).

BACKGROUND OF THE INVENTION

A computer system is generally comprised of several component parts including a processor, random access memory, a data bus, and other peripheral devices and components. The processor accesses, modifies, and writes data to random access memory. The data contained in random access memory is transferred to the processor through the data bus. One type of random access memory is dynamic random access memory (DRAM). As computer processor speeds increase, faster random access memory is needed to fully realize the potential of faster processor chips. One solution for faster random access memory is synchronous DRAM (SDRAM). SDRAM is tied to a system clock and is designed to be able to read or write from memory in burst mode (after the initial read or write latency) at one clock cycle per access (zero wait states) at memory bus speeds up to 100 MHz. However, current computer processor speeds often exceed the capability of SDRAM to provide data from memory.

Double Data Rate Synchronous Dynamic Random Access Memory (DDR-SDRAM) addresses the need for faster random access memory. DDR-SDRAM is similar in function to regular SDRAM, but it doubles the bandwidth of the memory by transferring data twice per cycle, on both the rising and falling edges of the clock signal. DDR-SDRAM returns a strobe signal synchronously with data signals. The strobe signal is related to the memory clock signal and indicates when valid data is ready for transfer from the DDR-SDRAM. Data signals are available on both the rising edge of the strobe signal and the falling edge of the strobe signal. Thus, two data signals are available with each clock cycle of a memory clock used for the DDR-SDRAM. In order to use DDR-SDRAM, the computer processor needs to synchronize the data coming from the DDR-SDRAM with the internal core clock of the computer processor chip. The internal core clock is often used to clock the data bus across which the data signals from the DDR-SDRAM are sent to the computer processor chip.

DDR-SDRAM may use a variety of DRAM configurations such as 4-bit DRAMs, 8-bit DRAMs, 16-bit DRAMs, or 32-bit DRAMs. Conventional synchronizers for DDR-SDRAM are usually designed for a single DDR-SDRAM configuration. Due to variations in DDR-SDRAM, the computer processor chip, and mother boards, strobe signals and data signals may not arrive together at the synchronizer. Conventional synchronizers for DDR-SDRAM are usually designed for a particular situation where the strobe signal and data signals do not arrive together. Therefore, it is desirable to provide a configurable synchronizer for DDR-SDRAM that allows the synchronizer to be optimized for various implementations.

SUMMARY OF THE INVENTION

From the foregoing, it may be appreciated that a need has arisen for a configurable synchronizer for DDR-SDRAM that provides improved flexibility and configurability. In accordance with the present invention, a configurable synchronizer for DDR-SDRAM is provided that substantially eliminates and reduces disadvantages and problems associated with conventional memory synchronizers.

According to an embodiment of the present invention, a configurable synchronizer for DDR-SDRAM is provided that includes a strobe select module operable to receive a memory select signal and to pass strobe signals from one or more DDR-SDRAMs to a number of synchronizer circuits corresponding to data signals passed in parallel by each DDR-SDRAM as indicated by the memory select signal. Each synchronizer circuit includes a rising edge latch for receiving a rising edge data signal from the DDR-SDRAM and to latch the rising edge data signal through the rising edge latch on a rising edge of the strobe signal. Each synchronizer circuit further includes a falling edge latch for receiving a falling edge data signal from the DDR-SDRAM and to latch the falling edge data signal through the falling edge latch on a falling edge of the strobe signal. Each synchronizer circuit further includes a data signal selector for receiving a data order control signal and to forward the rising edge data signal from the rising edge latch to an intermediate output on either a rising edge of a memory clock cycle or a falling edge of a memory clock cycle followed by forwarding the falling edge data signal from the falling edge latch to the intermediate output on an opposite edge of the memory clock cycle in response to the data order control signal. Each synchronizer circuit further includes an output latch operable to receive the intermediate output and to latch the intermediate output through the output latch to an output signal on each core clock cycle.

The present invention provides various technical advantages over conventional memory synchronizers. For example, one technical advantage is allowing various DDR-SDRAM configurations to be used with the configurable synchronizer. Another technical advantage is to provide several delay periods to delay a strobe signal so that it arrives with its associated data signals. Yet another technical advantage is to prevent false data signals from entering the configurable synchronizer by disabling the strobe signal after the last data signal is captured by the configurable synchronizer. A further technical advantage is in synchronization between the strobe signals and data signals from the DDR-SDRAM and a data bus clocked by an internal core clock with the synchronization window being movable in quarter cycle increments of a memory clock. Other technical advantages may be readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, in which like reference numbers represent like parts and wherein.

DETAILED DESCRIPTION OF THE INVENTION

Figure 1:
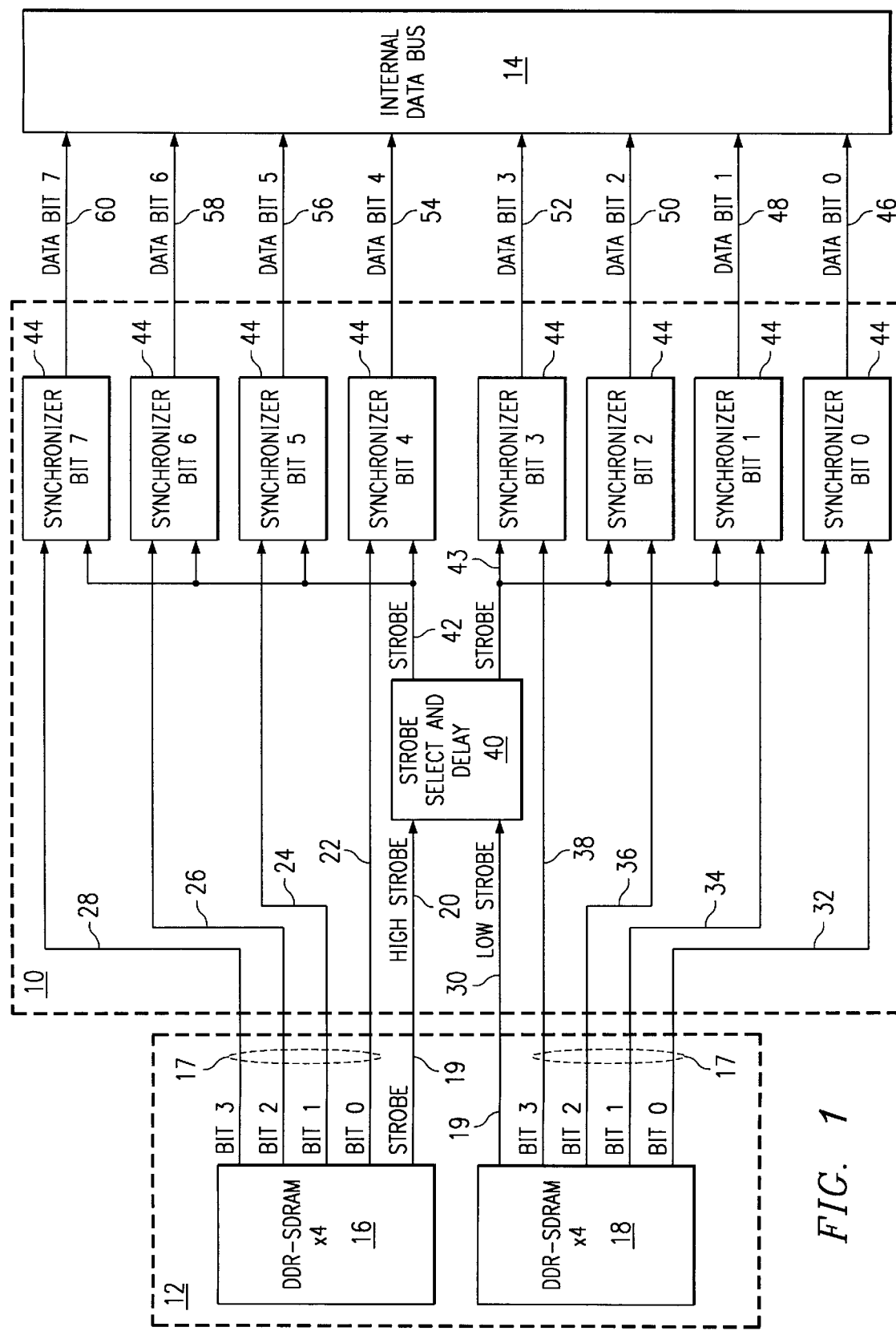
FIG. 1 is a block diagram of DDR-SDRAM coupled to data bus through a memory synchronizer.

Referring to FIG. 1, a configurable synchronizer for communications between DDR-SDRAM and an internal data bus is generally indicated at 10. In one embodiment, configurable synchronizer 10 synchronizes eight bits of DDR-SDRAM with an internal data bus 14. However, configurable synchronizer 10 may synchronize any suitable number of DDR-SDRAM bits with internal data bus 14. A block of DDR-SDRAM 12 provides input to configurable synchronizer 10 and may include eight bits of DDR-SDRAM corresponding to the eight data bits synchronized with internal data bus 14 by configurable synchronizer 10. It should be noted that internal data bus 14 may have a bandwidth of sixteen bits, thirty-two bits or more. However, any suitable data bus size may be used. Thus, for purposes of this disclosure, eight bits of data are transferred in parallel from block of DDR-SDRAM 12 through configurable synchronizer 10 into internal data bus 14. Additional configurable synchronizers 10 and blocks of DDR-SDRAM 12 may be used to provide internal data bus 14 with a number of data bits corresponding to the bandwidth of internal data bus 14. In one embodiment, a memory clock controls the operating frequency of block DDR-SDRAM 12 and core clock controls the operating frequency of internal data bus 14. In that embodiment, the memory clock operates at one-half the operating frequency of the core clock. For example, if the core clock operates at 200 megahertz, the memory clock would operate at 100 megahertz.

Various configurations of DDR-SDRAM may be used including 4-bit, 8-bit, or 16-bit configurations. In one embodiment, block of DDR-SDRAM 12 includes a high 4-bit DDR-SDRAM 16 and a low 4-bit DDR-SDRAM 18. Each 4-bit DDR-SDRAM has a strobe signal 19 and an output line 17 for each bit stored in the DDR-SDRAM. The strobe signal 19 indicates when valid data is available on the output lines 17. Strobe signal 19 is related to a memory clock signal used to clock block of DDR-SDRAM 12.

Configurable synchronizer 10 has inputs for eight bits numbered from bit 0 in the low order position to bit 7 in the high order position. These inputs include a bit 0 input 32, a bit 1 input 34, a bit 2 input 36, a bit 3 input 38, a bit 4 input 22, a bit 5 input 24, a bit 6 input 26, and a bit 7 input 28. Configurable synchronizer 10 also includes two strobe signal inputs so that configurable synchronizer 10 may process variously configured blocks of DDR-SDRAM 12 consisting of different subject DDR-SDRAMs. The two strobe signals are a high strobe input 20 and a low strobe input 30. Configurable synchronizer 10 also includes an output for each data bit input. The outputs include a bit 0 output 46, a bit 1 output 48, a bit 2 output 50, a bit 3 output 52, a bit 4 output 54, a bit 5 output 56, a bit 6 output 58, and a bit 7 output 60. The outputs of configurable synchronizer 10 are coupled to inputs for internal data bus 14.

In the embodiment of block of DDR-SDRAM 12 illustrated in FIG. 1 where block of DDR-SDRAM 12 includes high 4-bit DDR-SDRAM 16 and low 4-bit DDR-SDRAM 18, the strobe signal 19 from high 4-bit DDR-SDRAM 16 is coupled to high strobe input 20 of configurable synchronizer 10. The output lines 17 of high 4-bit DDR-SDRAM 16 are coupled as follows to configurable synchronizer 10: bit 0 output line 17 is coupled to bit 4 input 22; bit 1 output line 17 is coupled to bit 5 input 24; bit 2 output line 17 is coupled to bit 6 input 26; and bit 3 output line 17 is coupled to bit 7 input 28. The strobe signal 19 for low 4-bit DDR-SDRAM 18 is coupled to low strobe input 30. The output lines for low 4-bit DDR-SDRAM 18 are coupled as follows to configurable synchronizer 10: bit 0 output line 17 is coupled to bit 0 input 32; bit 1 output line 17 is coupled to bit 1 input 34; bit 2 output line 17 is coupled to bit 2 input 36; and bit 3 output line 17 is coupled to bit 3 input 38.

High strobe input 20 and low strobe input 30 are coupled to a strobe select and delay module 40. Strobe select and delay module 40 provides strobe control signals for a plurality of synchronizer circuits 44. Strobe select and delay module 40 may provide two sets of strobe control signals, high strobe control signals 42 and low strobe control signals 43, so that block of DDR-SDRAM 12 may use various configurations of DDR-SDRAM. Since block of DDR-SDRAM may use two 4-bit DDR-SDRAMs, synchronizer circuits 44 are grouped in two sets of four synchronizer circuits 44 so that a common control signal may be sent to each synchronizer circuit 44 in the group processing a parallel set of four data bits from a 4-bit DDR-SDRAM. The number of synchronizer circuits 44 corresponds to the number of data bit inputs and data bit outputs for configurable synchronizer 10. Thus, each data bit input line is coupled to a synchronizer circuit 44, and each data bit output line is also coupled to an output of a corresponding synchronizer circuit 44. Synchronizer circuits 44 synchronize data received from a common bank of DDR-SDRAM using a common strobe signal since data is available in parallel on the output lines of the common of DDR-SDRAM. Each synchronizer circuit 44 synchronizes a data bit of DDR-SDRAM 12 with internal data bus 14.

Figure 2:
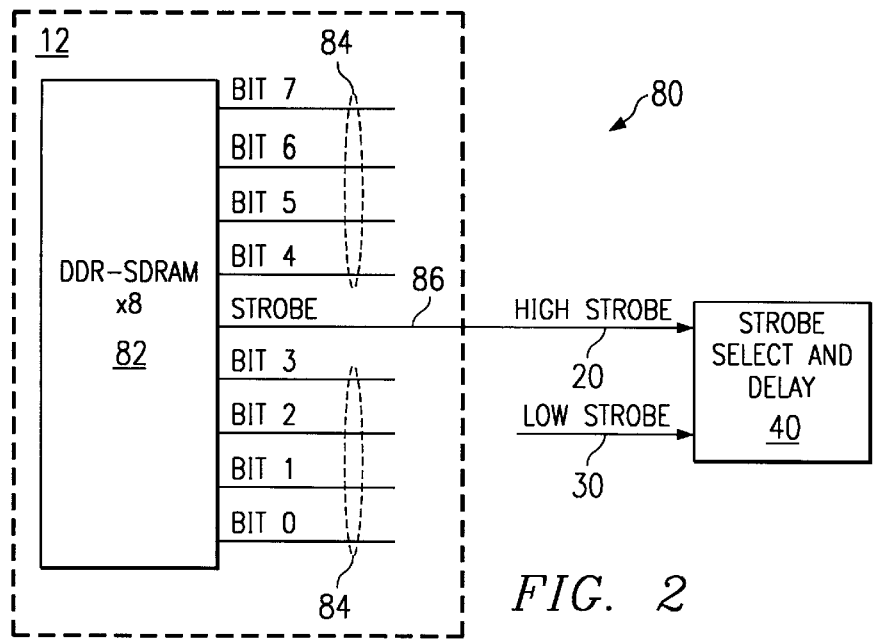
FIG. 2 illustrates the DDR-SDRAM of FIG. 1 as an 8 bit DDR-SDRAM.

Referring to FIG. 2, an embodiment of block of DDR-SDRAM 12 using an 8-bit DDR-SDRAM is generally indicated at 80. Block of DDR-SDRAM 12 includes an 8-bit DDR-SDRAM 82. 8-bit DDR-SDRAM 82 includes eight output lines 84 corresponding to each data bit transferred in parallel by 8-bit DDR-SDRAM 82 and a strobe signal 86 to indicate when valid data is available on the eight output lines 84. The eight output lines 84 of 8-bit DDR-SDRAM 82 are coupled to the eight corresponding data bit inputs of configurable synchronizer 10. The strobe signal 84 is coupled to high strobe input 20. Low strobe input 30 has no input. Strobe select and delay module 40 knows that block of DDR-SDRAM 80 consists of a single 8-bit DDR-SDRAM 82 and provides the same strobe control signals to each synchronizer circuit 44 in configurable synchronizer 10. Thus, strobe select and delay module 40 forwards the same strobe control signals across high strobe control signal 42 and low strobe control signal 43.

Figure 3:
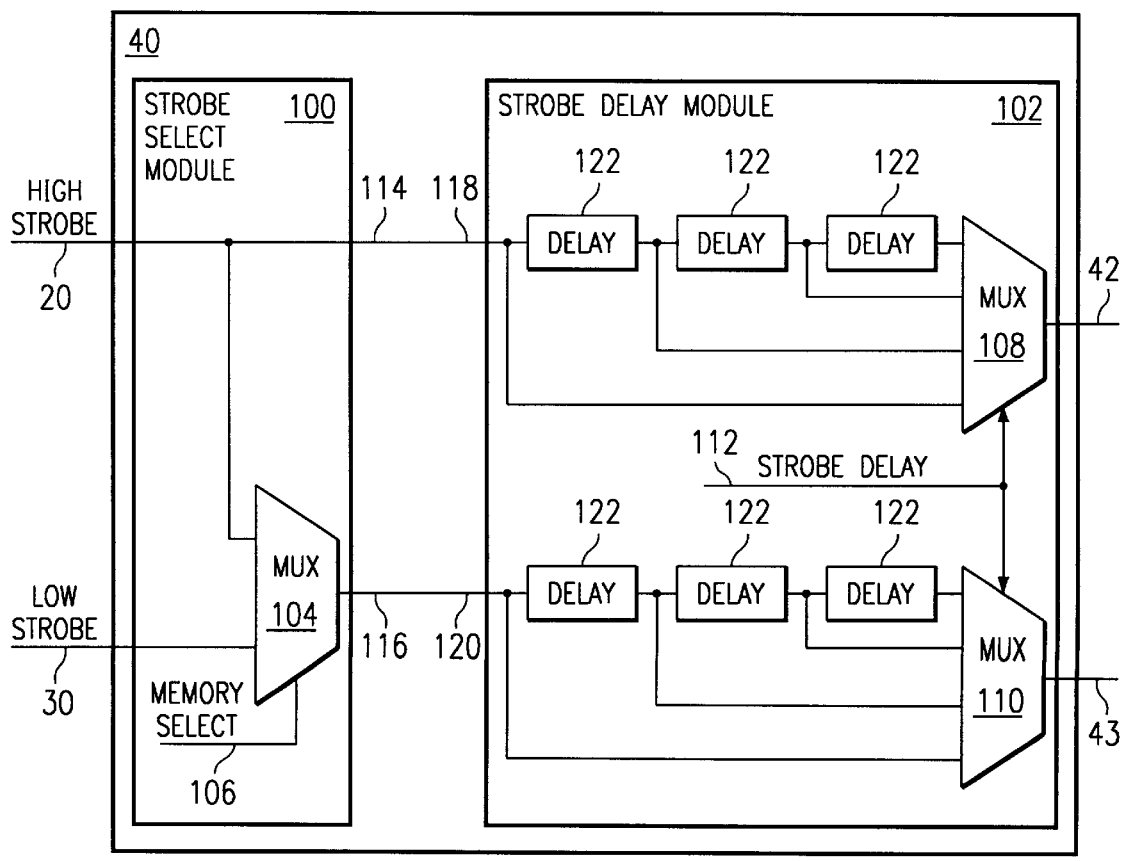
FIG. 3 illustrates a strobe select module and a strobe delay module.

Referring to FIG. 3, strobe select and delay module 40 is illustrated. Strobe select and delay module 40 includes a strobe select module 100 and a strobe delay module 102. Strobe select module 100 includes a multiplexor 104 and a memory select signal 106. High strobe input 20 and low strobe input 30 provide inputs to multiplexor 104, and memory select signal 106 provides a control signal for multiplexor 104. Memory select signal 106 indicates a bit size for DDR-SDRAM modules in block of DDR-SDRAM 12 currently being processed by configurable synchronizer 10. Memory select signal 106 may indicate that block of DDR-SDRAM 12 uses either 4-bit or 8-bit DDR-SDRAM modules. Memory select signal 106 is dynamic and may change as different blocks of DDR-SDRAM 12 are processed by configurable synchronizer 10. If memory select signal 106 indicates 4-bit DDR-SDRAM modules, high strobe input 20 and low strobe input 30 both receive valid strobe signals and are passed directly to high strobe output 114 and low strobe output 116, respectively. If memory select signal 106 indicates that an 8-bit DDR-SDRAM module is coupled to strobe select module 40, high strobe input 20 receives a valid strobe signal, but low strobe input 30 has no input. In that case, multiplexor 104 forwards high strobe input 20 to low strobe output 116 so that both high strobe output 114 and low strobe output 116 are identical.

This ensures that high strobe control signal 42 and low strobe control signal 43 are identical and correspond to the single strobe signal 86 of the 8-bit DDR-SDRAM 82.

Strobe delay module 102 receives high strobe output 114 on a high strobe delay input 118 and low strobe output 116 on a high strobe delay input 120. Strobe delay module 102 delays high strobe delay input 118 and low strobe delay input 120 as indicated by a strobe delay signal 112 before forwarding high strobe delay input 118 to high strobe control signal 42 and low strobe delay input 120 to low strobe control signal 43.

Strobe delay signal 112 provides a control signal for both a high multiplexor 108 and a low multiplexor 110. In one embodiment, strobe delay signal 112 may indicate one of four delays: 0 nanoseconds; 0.9 nanoseconds; 1.8 nanoseconds; or 2.7 nanoseconds. Both high strobe delay input 118 and low strobe delay input 120 are delayed by the same amount of time. Although the present embodiment provides four different delay periods, any number of delay periods of any suitable length may be used. In the present embodiment, three standard delays 122 are coupled in series between high strobe delay 118 and high multiplexer 108. Each delay 122 provides approximately 0.9 nanoseconds of delay. An input to each delay 122 is coupled to high multiplexer 108 thereby providing high strobe delay input 118 to high multiplexer 108 at each of four delay periods as previously described. Similarly, three standard delays 122 are coupled in a series between low strobe delay 120 and low multiplexer 110. Strobe delay signal 112 determines which delayed signal will be forwarded to high strobe control signal 42 and low strobe control signal 43. Strobe delay module 102 provides flexibility and configurability to account for differences in arrival time between strobe signals 19 and data signals 17 at configurable synchronizer 10. Strobe delay module 102 allows strobe signals from block of DDR-SDRAM 12 to be delayed such that the strobe signals are within the center of a data valid window. The data valid window of time during which data signals from block of DDR-SDRAM 12 are valid at synchronizer circuit 44. Strobe delay signal 112 is a static signal set during system testing to optimize performance of configurable synchronizer 10. Once strobe delay signal 112 is set, it generally is not changed unless system components change.

Figure 4:
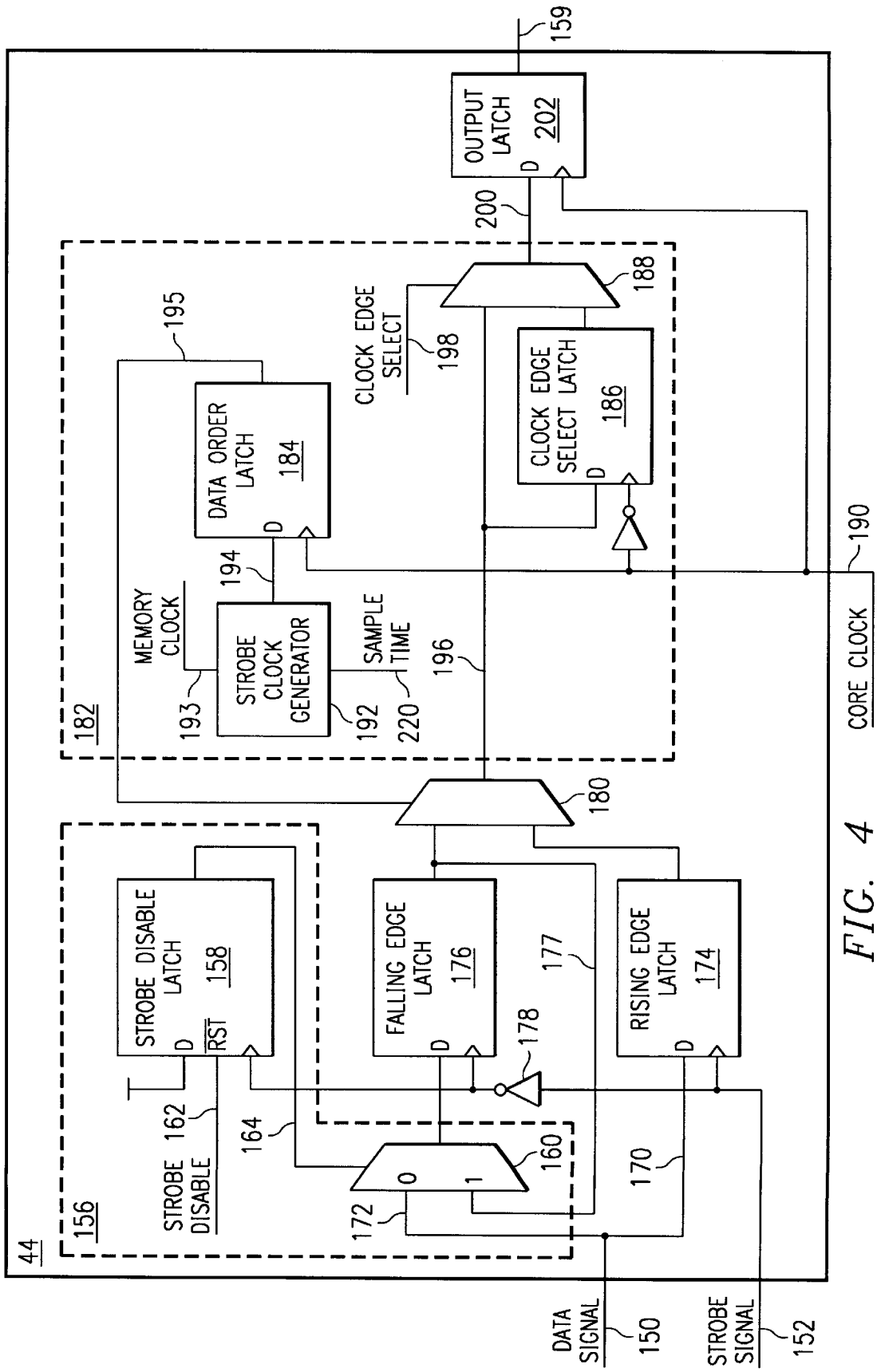
FIG. 4 illustrate a synchronizer circuit for a data bit.

Referring to FIG. 4, a synchronizer circuit 44 is illustrated. Synchronizer circuit 44 receives a data signal 150 from block of DDR-SDRAM 12 and a strobe signal 152 from strobe select and delay module 40. Synchronizer circuit 44 generates an output signal 154. DDR-SDRAM can provide data signals on both the rising edge and the falling edge of a memory clock signal. Therefore, DDR-SDRAM may transfer two bits of data across the same line in one memory clock cycle. Strobe signal 152 is related to a memory clock cycle signal. Strobe signal 152 is present when data is available at data signal 150. Strobe signal 152 has a period equal to the memory clock cycle. However, the rising and falling edges of strobe signal 152 may be slightly offset from the rising and falling edges of the memory clock cycle due to circuit path lengths and other factors.

Since DDR-SDRAM can provide data signals on both the rising edge and falling edge of strobe signal 152, data signal 150 is split into a rising edge data signal 170 and a falling edge data signal 172. Rising edge data signal 170 is coupled to a rising edge latch 174, and falling edge data signal 172 is coupled through a strobe disable multiplexer 160 to a falling edge latch 176.

Strobe signal 152 is coupled to the clock inputs of rising edge latch 174 and falling edge latch 176. Rising edge latch 174 may be a D-type flip-flop and may change states with each rising edge of strobe signal 152. An inverter 178 inverts strobe signal 152 causing falling edge latch 176 to change state on the falling edge of strobe signal 152. Therefore, on the rising edge of strobe signal 152, a data value from rising edge data signal 170 is latched into rising edge latch 174, and on the falling edge of strobe signal 152, a data value from falling edge data signal 172 is latched into falling edge latch 176.

Since data signals 150 may be provided on both the rising edge and the falling edge of strobe signal 152 and strobe signal 152 is bi-directional, false data may be processed in configuration synchronizer 10 after the last falling edge of strobe signal 152 during a read burst. Depending on the termination scheme of strobe signal 152, strobe signal 152 may be either a logic level 1 or a logic level 0 after the last falling edge of the read burst. If the last falling edge of the read burst happens before the end of the core clock cycle, the block of DRR-SDRAM 12 may release the data bus 14 thereby causing invalid data to be latched into falling edge latch 176 overwriting valid data that has not yet been latched out of falling edge latch 176 towards output latch 202. A strobe disable section 156 of synchronizer circuit 44 prevents invalid data from being latched into falling edge latch 176 after the last falling edge of strobe signal 152 related a read burst.

Strobe disable section 156 includes a strobe disable latch 158, a strobe disable multiplexer 160, and a strobe disable signal 162. Strobe disable section 156 may also be referred to as a strobe disable module. Strobe disable latch 158 includes an input line with a constant logic level "1" signal, a reset line operable when its input is a logic level "0", and an output line. Strobe disable signal 162 is coupled to the reset line, and the output line provides a control signal for strobe disable multiplexer 160. Strobe disable latch 158 is clocked by an inversion of strobe signal 152. Thus, strobe disable latch 158 changes state on the falling edge of strobe signal 152.

Strobe disable latch 158 provides a control signal 164 for strobe disable multiplexer 160. A control signal 164 of logic level "0" causes strobe disable multiplexer 160 to forward falling edge data signal 172 to falling edge latch 176 and to the remainder of synchronizer circuit 44. A control signal 164 of logic level "1" causes the output of falling edge latch 176 to recirculate through strobe disable multiplexer 160 using a recirculate path 177 thereby preventing a change in state of falling edge latch 176 until strobe disable signal 162 enables strobe disable latch 158.

Strobe disable signal 162 is a dynamic control signal that indicates when valid data is available for processing on data signal 150. When valid data is available, the strobe disable signal 162 is a logic level "0" thereby causing strobe disable latch 158 to reset and provide a control signal 164 of logic level "0". After the last falling edge of strobe signal 152 related to a read burst, strobe disable signal 162 indicates that the final data value of the read burst has been obtained and that no further data values are currently available. After the final data value, strobe disable signal 162 is a logic level "1" causing strobe disable latch 158 to latch the "D" input (logic level "1") through to control signal 164.

A data order multiplexer 180 alternately forwards the output of rising edge latch 174 and the output of falling edge latch 176 to a configuration section 182 of synchronizer circuit 44. Configuration section 182 allows for quarter cycle granularity with respect to synchronizing block of DDR-SDRAM 12 with internal data bus 14. Configuration section 182 includes s strobe clock generator 192, a data order latch 184, a clock edge select latch 186, and a clock edge select multiplexer 188. A core clock 190 provides clock input for data order latch 184 and clock edge select latch 186.

A strobe clock generator 192 generates a strobe clock signal 194 for controlling the operation of data order multiplexer 180. Strobe clock generator 192 receives a sample time 220 and a memory clock 193 and generates a strobe clock signal 194. Strobe clock signal 194 is latched through data order latch 184 to provide a data order control signal 195 to data order multiplexer 180. Memory clock 193 generates a clock signal with each clock cycle having a rising edge and a falling edge. Strobe clock generator 192 alternates strobe clock signal 194 with each edge of memory clock 193 cycle. Thus, data order multiplexer 180 toggles output 196 between the output of rising edge latch 174 and the output of falling edge latch 176 with each core clock 190 cycle since data order latch 184 is clocked by core clock 190.

Sample time 220 selects the base range of the DDR-SDRAM data synchronization window. Sample time 220 and memory clock 193 are used to determine whether the output of rising edge latch 174 or the output of falling edge latch 176 is forwarded to configuration section 182 on output 196 with the rising edge of memory clock 193 cycle. Thus, depending on the sample time 220, the output of rising edge latch 174 may be forwarded through data order multiplexer 180 on the rising edge of memory clock 193 cycle or the falling edge of memory clock 193 cycle. As previously described, the rising and falling edges of strobe signal 152 may be offset from memory clock 193 cycle so the output of rising edge latch 174 may not be available until the falling edge of memory clock 193 cycle. In one embodiment, the base range identified by sample time 220 is either 5 nanoseconds to 15 nanoseconds or 10 nanoseconds to 20 nanoseconds. Sample time 220 determines whether the output of rising edge latch 174 is forwarded on the rising edge of memory clock 193 cycle or the falling edge of memory clock 193 cycle. Since memory clock 193 cycle may not rise and fall at the exact time that strobe signal 152 rises and falls, sample time 220 allows the data signals from rising edge latch 174 and falling edge latch 176 to be forwarded with relation to the rising and falling edges of memory clock 193. Sample time 220 is a static signal that is set during initial testing of configurable synchronizer 10. Once sample time 220 is set, it is not generally reset unless system components change or system processing speed changes.

Data order latch 184 synchronizes strobe clock signal 194 with core clock 190. With each rising edge of core clock 190 cycle, data order latch 184 changes state thereby producing a data order control signal 195 with each core clock 190 cycle. Therefore, data order multiplexer 180 alternates between the output of rising edge latch 174 and the output of falling edge latch 176 with each core clock 190 cycle. Data order latch 184, strobe clock generator 192, and their associated input signals may together be referred to as a data order module. The data order module generates the data order control signal 195.

A clock edge select signal 198 allows configuration section 182 to provide an output signal 200 on the rising edge of core clock 190 or the falling edge of core clock 190. Clock edge select signal 198 is a static signal that is set on either the rising edge of core clock 190 cycle or the falling edge of core clock 190 cycle during initial system testing. Once clock edge select signal 198 is set, it is generally not reset unless system components are changed.

Output 196 of data order multiplexer 180 is coupled to one input of clock edge select multiplexer 188. That input provides a different data signal on each rising edge of core clock 190. The output 196 of data order multiplexer 180 is also coupled to clock edge select latch 186. Clock edge select latch 186 changes state on the falling edge of core clock 190 as indicated by an inverted core clock 190 signal coupled to the clock input of clock edge select latch 186. The output of clock edge select latch 186 is coupled to a second input of clock edge select multiplexer 188. That input provides a different data signal with each falling edge of core clock 190. Clock edge select latch 186, clock edge select multiplexer 188, and clock edge select signal 198 may be referred to as a cycle increment module. The cycle increment module receives a clock edge select signal 198 and forwards the output 196 of data order multiplexer 180 to the output latch 202 on either a rising edge of the core clock 190 cycle or a falling edge of the core clock 190 cycle in response to the clock edge select signal 198.

Clock edge select signal 198 and sample time 220 allow configuration of synchronizer circuit 44 to quarter cycle granularity thereby optimizing the performance and processing speed of a computer system using configurable synchronizer 10. Providing configuration of synchronizer circuit 44 in quarter cycle granularity allows a computer system using configurable synchronizer 10 to be run at different speeds and to be margin tested to determine an optimal operating speed for a computer system.

An output latch 202 provides an output signal 154 from synchronizer circuit 44. Output latch 202 receives as input the output signal 200 from clock edge select multiplexer 188. Output latch 202 is clocked by core clock 190 thereby forwarding output signal 200 to output signal 154 with each rising edge of core clock 190.

Figure 5:
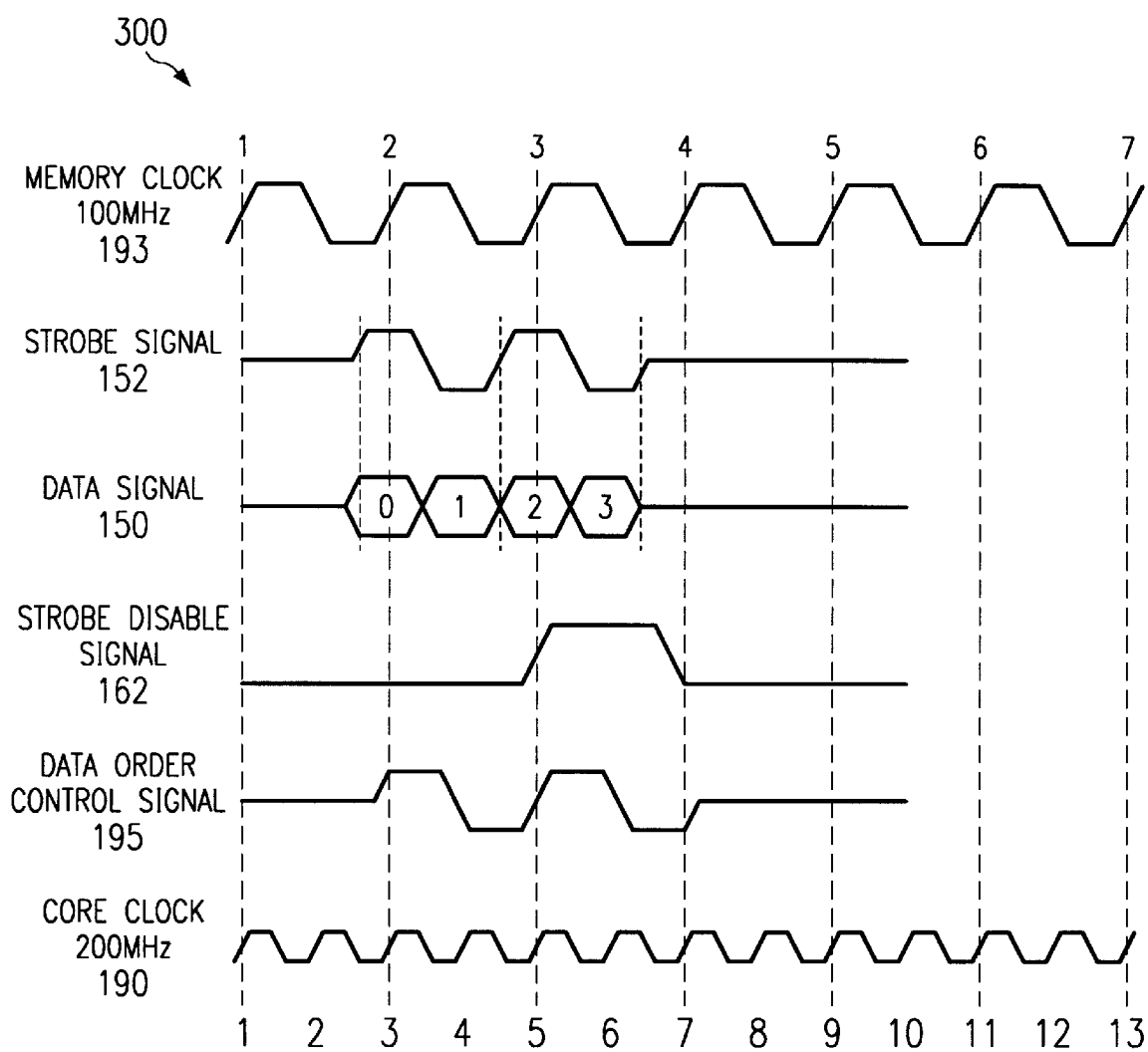
FIG. 5 illustrates a timing diagram for the memory synchronizer.

Referring to FIG. 5, a timing diagram for configurable synchronizer 10 is generally indicated at 300. The timing diagram shows the relationship between memory clock 193, core clock 190, strobe signal 152, data signal 150, strobe disable signal 162, and data control signal 195.

Thus, it is apparent that there has been provided, in accordance with the present invention, a configurable synchronizer for double data rate synchronous dynamic random access memory that satisfies the advantages set forth above. Although the present invention and its advantages have been described in detail, it should be understood that various changes, substitutions, and alterations may be readily apparent to those skilled in the art and may be made herein without departing from the spirit and the scope of the present invention as defined by the following claims.

What is claimed is:

1. A configurable synchronizer for DDR-SDRAM, comprising:

a strobe select module operable to receive a memory select signal and to pass strobe signals from one or more DDR-SDRAMs;

one or more synchronizer circuits corresponding to data signals passed in parallel by each DDR-SDRAM as indicated by the memory select signal;

wherein each synchronizer circuit includes:

a rising edge latch operable to receive a rising edge data signal from the DDR-SDRAM and to latch the rising edge data signal through the rising edge latch on a rising edge of the strobe signal;

a falling edge latch operable to receive a falling edge data signal from the DDR-SDRAM and to latch the falling edge data signal through the falling edge latch on a falling edge of the strobe signal;

a data signal selector operable to receive a data order control signal and to forward the rising edge data signal from the rising edge latch to an intermediate output on either a rising edge of a memory clock cycle or a falling edge of a memory clock cycle followed by forwarding the falling edge data signal from the falling edge latch to the intermediate output on an opposite edge of the memory clock cycle in response to the data order control signal;

an output latch operable to receive the intermediate output and to latch the intermediate output through the output latch to an output signal on each core clock cycle.

2. The configurable synchronizer of claim 1, further comprising:
a strobe delay module coupled to the strobe select module and operable to receive a strobe delay signal and to delay the strobe signal for a period of time as indicated by the strobe delay signal.

3. The configurable synchronizer of claim 1, further comprising:
a strobe disable module coupled to the falling edge latch and operable to receive a strobe disable signal and to recirculate data from a falling edge latch after receiving a final falling edge data signal in a read burst from the DDR-SDRAM in response to the strobe disable signal, the strobe disable module preventing false data from being latched into the falling edge latch, the strobe disable signal indicating the arrival of the final falling edge data signal in the read burst from the DDR-SDRAM.

4. The configurable synchronizer of claim 1, further comprising:
a cycle increment module coupled to the output latch and operable to receive a clock edge select signal and to forward the intermediate output to the output latch on either a rising edge of the core clock cycle or a falling edge of the core clock cycle in response to the clock edge select signal.

5. The configurable synchronizer of claim 1, further comprising:
a data order module operable to receive the memory clock cycle and a sample time, the data order module further operable to generate a data order control signal on the rising edge of the memory clock cycle for either the latched rising edge data signal or the latched falling edge data signal in response to the sample time, the data order module further operable to generate a data order control signal on the falling edge of the memory clock cycle for the data signal not selected on the rising edge of the memory clock cycle, the sample time indicating which latched data signal should be selected first in the data signal selector.

6. The configurable synchronizer of claim 1, wherein the memory clock cycle is equal to approximately two core clock cycles.

7. The configurable synchronizer of claim 1, wherein the one or more DDR-SDRAMs includes a DDR-SDRAM selected from the group consisting of:
an 8-bit DDR-SDRAM;
a 16-bit DDR-SDRAM; and
a 32-bit DDR-SDRAM.

8. The configurable synchronizer of claim 1, wherein the one or more DDR-SDRAMs includes two 4-bit DDR-SDRAM modules, each DDR-SDRAM module transmitting a strobe signal.

9. The configurable synchronizer of claim 8, wherein the strobe select module is further operable to pass the strobe signal for the DDR-SDRAM to the synchronizer circuits corresponding to the data signals passed by the DDR-SDRAM module.

10. The configurable synchronizer of claim 1, wherein the memory select signal indicates that the one or more DDR-SDRAMs includes a DDR-SDRAM module selected from the group consisting of:
an 8-bit DDR-SDRAM module;
a 16-bit DDR-SDRAM module; and
a 32-bit DDR-SDRAM module.

11. The configurable synchronizer of claim 1, wherein the memory select signal indicates that the one or more DDR-SDRAMs includes two 4-bit DDR-SDRAM modules.

12. The configurable synchronizer of claim 2, wherein the strobe delay signal indicates a delay sufficient to allow the strobe signal to be within a center of a data valid window.

13. The configurable synchronizer of claim 12, wherein the strobe delay signal indicates a delay chosen from the group consisting of: 0 nanoseconds, 0.9 nanoseconds, 1.8 nanoseconds, and 2.7 nanoseconds.

14. A method for synchronizing a DDR-SDRAM with a core clock, comprising:
receiving a strobe signal associated with a DDR-SDRAM module;
receiving a rising edge data signal from the DDR-SDRAM on a rising edge of the strobe signal;
receiving a falling edge data signal from the DDR-SDRAM on a falling edge of the strobe signal;
latching the rising edge data signal on a rising edge of the strobe signal;
latching the falling edge data signal on a falling edge of the strobe signal;
selecting either the latched rising edge data signal or the latched falling edge data signal in response to a data order control signal, the data order control signal alternating between selecting the latched rising edge data signal and the latched falling edge data signal;
latching the selected signal onto a data output signal on each cycle of a core clock.

15. The method of claim 14, further comprising:
delaying the strobe signal for a period of time in response to a strobe delay signal.

16. The method of claim 14, further comprising:
recirculating the falling edge data signal in response to receiving a strobe disable signal indicating that a final falling edge data signal has been received for a read burst.

17. The method of claim 14, further comprising:
delaying the selected signal for one half of a core clock cycle before providing the selected signal to the final latching step in response to a clock edge select signal.

18. The method of claim 14, wherein delaying the strobe signal includes choosing a delay period that allows a strobe signal associated with the data signals to be within a center of a data valid window.

19. The method of claim 14, further comprising:
receiving a memory select signal indicating a size of the DDR-SDRAM module.

20. The method of claim 14, further comprising:
generating a data order control signal from a memory clock cycle and a sample time, the sample time indicating whether the latched rising edge data signal or the latched falling edge data signal should be selected on a rising edge of the memory clock cycle, the data order control signal indicating which data signal to select on the rising edge of the memory clock cycle and on the falling edge of the memory clock cycle, a different data signal being selected on each edge of the memory clock cycle.

* * * * *